United States Patent
Conti et al.

(10) Patent No.: US 6,911,378 B2
(45) Date of Patent: Jun. 28, 2005

(54) STABILIZATION OF FLUORINE-CONTAINING DIELECTRIC MATERIALS IN A METAL INSULATOR WIRING STRUCTURE

(75) Inventors: Richard A. Conti, Katonah, NY (US); Kenneth Davis, Newburgh, NY (US); John A. Fitzsimmons, Poughkeepsie, NY (US); David L. Rath, Stormville, NY (US); Daewon Yang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,060

(22) Filed: Jun. 24, 2003

(65) Prior Publication Data

US 2004/0266140 A1 Dec. 30, 2004

(51) Int. Cl.[7] .............................. H01L 21/322
(52) U.S. Cl. .................. 438/475; 438/622; 438/761; 438/783; 438/473; 438/474; 438/795; 438/800; 257/645; 257/651; 257/958
(58) Field of Search .................. 438/475, 622, 438/761, 783, 473, 474, 795–800, 958; 257/645, 651, 958

(56) References Cited

U.S. PATENT DOCUMENTS

| | | | | |
|---|---|---|---|---|
| 5,930,655 A | * | 7/1999 | Cooney et al. | 438/474 |
| 6,153,514 A | * | 11/2000 | Wang et al. | 438/640 |
| 6,309,955 B1 | * | 10/2001 | Subramanian et al. | 438/618 |
| 6,433,432 B2 | * | 8/2002 | Shimizu | 257/758 |
| 6,448,655 B1 | | 9/2002 | Babich et al. | |
| 6,452,251 B1 | | 9/2002 | Bernstein et al. | |
| 6,699,531 B1 | * | 3/2004 | Fukiage | 427/535 |
| 2002/0063312 A1 | * | 5/2002 | Towle et al. | 257/645 |

* cited by examiner

Primary Examiner—B. William Baumeister
Assistant Examiner—Victor V. Yevsikov
(74) Attorney, Agent, or Firm—Lisa U. Jaklitsch; Cantor Colburn LLP

(57) ABSTRACT

A process for providing regions of substantially lower fluorine content in a fluorine-containing dielectric comprises exposing the fluorine-containing dielectric to a reactive species to form volatile byproducts.

21 Claims, 2 Drawing Sheets

STABILIZATION OF FLUORINE-CONTAINING DIELECTRIC MATERIALS IN A METAL INSULATOR WIRING STRUCTURE

BACKGROUND OF INVENTION

The present disclosure generally relates to semiconductor apparatuses and manufacturing processes, and more particularly, relates to a post chemical mechanical polishing (CMP) process for use with fluorinated silicate glass.

In conventional integrated circuit fabrication, circuit elements are formed by etching a pattern of gaps in a layer of metal such as aluminum. The gaps are then filled with a dielectric such as silicon dioxide. Copper is now being used as the metal conductor for most types of integrated circuits because of its lower resistance when compared to conventional aluminum alloys. Because it is difficult to etch copper, however, damascene processes have been developed for fabricating copper-based integrated circuits. In damascene processes, dielectric layers are deposited and then etched to form gaps that are subsequently overfilled with copper. Once the copper layer is formed, the substrate subsequently undergoes a planarization process to remove conductive material above the dielectric, such as by chemical mechanical polishing. The process is repeated as necessary for each additional layer.

The low dielectric constants of fluorine-containing dielectrics such as fluorinated diamond-like-carbon, fluorinated silicon oxide, and fluorinated silicate glass, make them potentially useful as interlayer dielectric materials in high performance VLSI and ULSI chips where interconnect wiring capacitance must be minimized. Fluorine-containing dielectrics can be deposited in conventional PECVD systems, which have been widely used for undoped silicate glass and fluorine-containing dielectrics in aluminum interconnects. Fluorine-containing dielectrics generally have a good process scheme in terms of reliability, stability, and throughput. Furthermore, the electrical performance of integrated circuits can be significantly improved due to the lower dielectric constant of fluorine-containing dielectrics (about 3.4 to about 3.7 compared to about 4.1 for conventional silicon oxides). The lower dielectric constant reduces the capacitance between metal lines in the same layer and reduces cross talk across layers.

Unfortunately, the presence of fluorine-containing dielectrics in metal insulator wiring structures raises other issues. It has been found that fluorine-containing dielectrics cannot be easily integrated into these interconnect structures. For example, it has been found that fluorine in the fluorine-containing dielectric can react with copper metal conductors in presence of water and cause the copper metal conductor to redeposit and form dendrite- or nodule-like structures. The relative humidity in the fabrication environment provides sufficient amounts of moisture for this reaction to occur. While the exact mechanism is presently unknown, it is believed that an electrochemical reaction occurs that is facilitated by the presence of fluorine and water. While interlayer dielectrics with reduced fluorine contents would be expected to have smaller amounts of fluorine available to react, lower fluorine-content interlayer dielectrics have undesirably higher k values.

Current methods to overcome this phenomenon generally require a capping or liner material, or rely on time-based measurements. Capping materials such as the silicon oxide and silicon nitride insulators, and the conductive liner materials such as TiN have previously been described for use with fluorine-free interlayer dielectrics as (i) diffusion barriers (to prevent atoms of wiring material from diffusing into the interlayer dielectric, from where they may readily diffuse into active device regions), (ii) etch stop and permanent masking materials, and (iii) adhesion layers.

With regard to time-based measurements, once a predetermined period of time has expired, the substrate must be treated to remove the corrosion of the conductors, such as by chemical mechanical polishing. The predetermined periods of time before corrosion occurs is relatively short and as such, time based measurements are generally not a practical solution.

Accordingly, there remains a need to prevent corrosion of metal conductors in contact with fluorine-containing dielectrics as well as prevent the formation of dendritic or nodule-like structures.

SUMMARY OF INVENTION

A process for lowering fluorine content after metal fill and planarization of a metal conductor and fluorine-containing dielectric wire structure, comprising generating atomic hydrogen species; and exposing the fluorine-containing dielectric to the atomic hydrogen species in an amount effective to lower the fluorine content in the fluorine-containing dielectric.

In another embodiment, a process for forming a wiring structure including a copper metal conductor and a fluorine-containing dielectric, comprising forming a gap in a layer of the fluorine-containing dielectric; overfilling the gap with the copper metal conductor; planarizing and removing the copper metal conductor above the fluorine-containing dielectric to expose a surface of the fluorine-containing dielectric; forming a plasma from a hydrogen bearing gas to generate atomic hydrogen species; exposing the surface of the fluorine-containing dielectric to the atomic hydrogen species; and removing fluorine from the surface of the fluorine-containing dielectric.

In another embodiment, a process for lowering fluorine content after metal fill and planarization of a metal conductor and fluorine-containing dielectric wire structure comprises generating atomic nitrogen species; and exposing the fluorine-containing dielectric to the atomic nitrogen species in an amount effective to lower the fluorine content in the fluorine-containing dielectric.

The above described and other features are exemplified by the following figures and detailed description.

BRIEF DESCRIPTION OF DRAWINGS

Referring now to the figures, which are exemplary embodiments and wherein the like elements are numbered alike.

DETAILED DESCRIPTION

Figure 1:
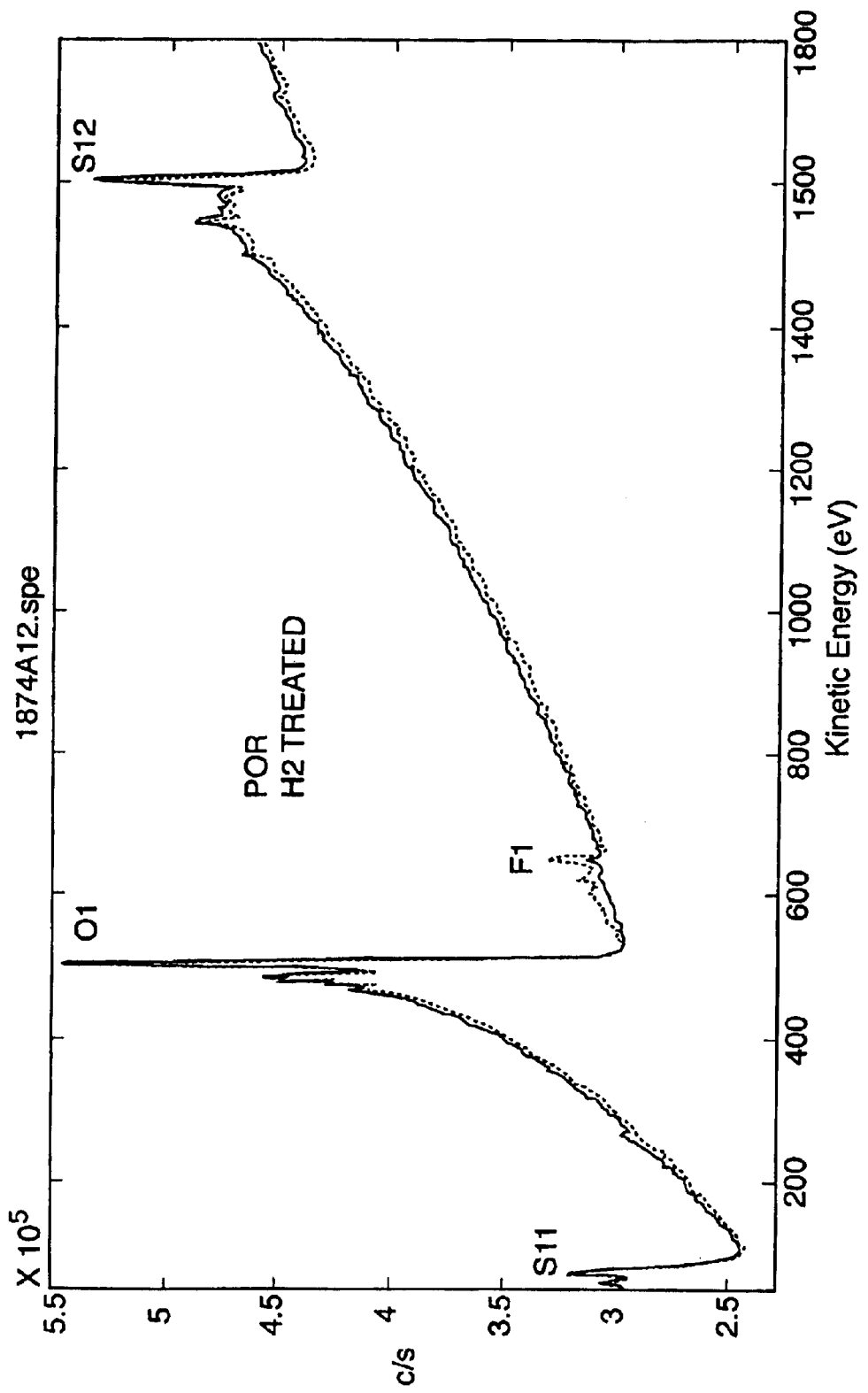
FIG. 1 graphically illustrates Auger Electron Spectroscopy results for a copper/fluorinated TEOS wiring structure before and after treatment with atomic hydrogen species.

Disclosed herein is a process for providing regions of substantially lower fluorine content in surfaces of fluorine-containing dielectrics. The process generally comprises exposing the fluorine-containing dielectric to plasma formed from a gas mixture comprising a hydrogen-bearing compound. The regions exposed to the plasma are preferably those surfaces of the fluorine-containing dielectric that are exposed after metal fill and planarization. The plasma generated from the hydrogen bearing gas comprises reactive atomic hydrogen species that react with fluorine in the fluorine-containing dielectric to form volatile species, which are then removed. In a preferred embodiment, the process is used with semiconductor substrates including fluorine silicate glass materials and/or copper metal layers.

The particular components of the hydrogen bearing plasma gas mixture are selected by their ability to form a gas and plasma at plasma forming conditions. The plasma generated from the gas mixture generates hydrogen reactive species that react with fluorine in the fluorine-containing dielectric so as to lower the fluorine content in and on the surface of the fluorine-containing dielectric. Exposure to the plasma is preferably for a period of time effective to remove a sufficient amount of fluorine species from surfaces of the fluorine-containing dielectric that will be exposed after metal fill and planarization. In this manner, the fluorine-containing dielectric layer is effectively sealed from interaction with the metal conductor as the integrated circuit is manufactured. Thus, corrosion of the metal conductor layers caused by interaction with fluorine can be effectively prevented without having to rely on a time-based method or a capping layer.

The hydrogen bearing compounds include those compounds that contain hydrogen, for example, hydrocarbons, hydrofluorocarbons, hydrogen gas, water vapor, ammonia, or hydrogen gas mixtures. The preferred hydrogen bearing compounds are ones that generate sufficient atomic hydrogen species to lower fluorine content from and about surfaces of the fluorine-containing dielectric. Particularly preferred hydrogen bearing compounds are those that exist in a gaseous state and release hydrogen to form atomic hydrogen species such as free radicals or hydrogen ions under plasma forming conditions. The gas may be a hydrocarbon that is unsubstituted or may be partially substituted with a halogen such as bromine, chlorine, or fluorine, or with oxygen, nitrogen, hydroxyl, and amine groups. Examples of suitable hydrogen bearing gases include methane, ethane, ammonia, propane, and the like.

The hydrogen gas is preferably in the form of a gas mixture. Preferred hydrogen gas mixtures are those gases that contain hydrogen gas and an inert gas. Examples of suitable inert gases include argon, nitrogen, neon, helium and the like. Especially preferred hydrogen gas mixtures are so-called forming gases that consist essentially of hydrogen gas and nitrogen gas. Particularly preferred is a forming gas composition, wherein the hydrogen gas ranges in an amount of about 1 percent to about 5 percent by volume of the total forming gas composition. Although amounts greater than 5 percent can be utilized, safety becomes an issue due to risk of explosion of the hydrogen gas. However, higher amounts of hydrogen are acceptable and sometimes preferred for increasing process times.

In an alternative embodiment, reactive nitrogen species are generated that react with fluorine in the fluorine-containing dielectric to form volatile species, which are then removed. The reactive nitrogen species may be generated from nitrogen gas ($N_2$) or a mixture containing nitrogen gas such as an argon and nitrogen gas mixture.

In a preferred embodiment, the process removes fluorine from or about a surface of the fluorine-containing dielectric to an amount less than about 2 percent fluorine. It has been found that fluorine in amounts less than about 2 percent result in a stable matrix within the dielectric that is generally unreactive to metal conductors or do not have a propensity to form dendritic or nodule like structures over time.

The depth of fluorine surface depletion from the fluorine-containing dielectric is preferably less than or equal to about 20 percent of the thickness of the dielectric, with less than or equal to about 10 percent more preferred, and with less than or equal to about 5 percent even more preferred. Also preferred is a minimum depth of fluorine surface depletion of about 50 angstroms, with a minimum depth of fluorine surface depletion of about 200 angstroms even more preferred, with a minimum depth of fluorine surface depletion of about 500 angstroms even more preferred, and with a minimum depth of fluorine surface depletion of about 700 angstroms most preferred.

Thickness loss from lowering the fluorine content is preferably less than about 500 angstroms, with less than about 400 angstroms more preferred, with less than about 300 angstroms even more preferred. The amounts of thickness loss can be readily monitored using conventional techniques known to those in the art.

The plasma process as described herein preferably occurs after metal fill and planarization of the metal layer, such as by chemical mechanical processing. For example, in a damascene process, gaps are formed in the fluorine-containing dielectric layer, which are then overfilled with a metal conductor material, e.g., copper. The excess metal conductor material is removed to the fluorine-containing dielectric by a planarization process. At this point in the fabrication of the integrated circuit, the planar surface includes exposed metal conductor and fluorine-containing dielectric surfaces. The plasma mediate process is preferably employed at this point to lower the fluorine content in the exposed fluorine dielectric surfaces resulting from planarization.

Although reference has been made to the use of plasmas, in another embodiment, the exposed fluorine-containing dielectric surfaces are exposed to a hydrogen bearing gas as described above in a furnace or oven at an elevated temperature for a period of time effective to lower the fluorine content in the exposed fluorine-containing dielectric surfaces.

Suitable fluorine-containing dielectrics for use in the present disclosure include, but are not intended to be limited to, fluorinated diamond like carbon dielectric; fluorinated diamond like carbon dielectrics with additives such as H, Si, Ge, N and O; fluorinated silicon oxide; fluorinated silicon glass; organo-inorganic dielectrics containing fluorine; organic dielectrics containing fluorine; and the like.

The plasma process of lowering the fluorine content in fluorine-containing dielectrics is not intended to be limited to any particular plasma apparatus. For example, a plasma apparatus employing an inductively coupled plasma reactor could be used or a downstream plasma apparatus could be used. Preferably, the plasma apparatus is a downstream plasma apparatus, such as for example, a microwave downstream plasma apparatus. Process parameters are generally tool dependent. Process time is preferably kept to a minimum and should be sufficient to effectively provide the desired amount of fluorine depletion from the surface of the fluorine-containing dielectric. Moreover, the power, temperature, flow rates, and other parameters can be adjusted as is recognized in the art to optimize fluorine depletion.

Optionally, the layers are passivated after lowering the fluorine content as described in the various embodiments.

Passivation can be by any means including but not limited to exposing the surfaces to a solution containing benzotriazole, imidazole, tolyltriazole, thiourea, benzimidazole, benzofloxane, 2,1,3-benzothiadiazole, 2-mercaptobenzothiazole, 2-mercaptobenzothiadiazole, 2-mercaptobenzooxazole, melamine, or the like.

The disclosure is further illustrated by the following non-limiting examples.

EXAMPLE 1

In this example, a copper metal/fluorinated tetraethylorthosilicate dielectric wiring structure after chemical mechanical planarization was exposed to plasma generated from hydrogen gas. The plasma apparatus was a Novellus Concept 3 High Density Plasma CVD apparatus commercially available from Novellus Systems, Inc. During operation at a power of 3200 watts, hydrogen gas was flowed at a rate of 700 sccm to generate the hydrogen reactive species. The substrate was unbiased during exposure to the atomic hydrogen species generated in the plasma from hydrogen gas.

FIG. 1 graphically illustrates Auger Electron Spectroscopy (AES) results generated using a 20 keV electron beam before and after plasma treatment. The main peaks for fluorine occur between about 650 to about 700 electron volts. As shown, the fluorine peak (F1) prior to hydrogen plasma exposure is readily detectable whereas after hydrogen plasma exposure, the fluorine peak absorption is significantly decreased and is essentially non-detectable.

Figure 2:
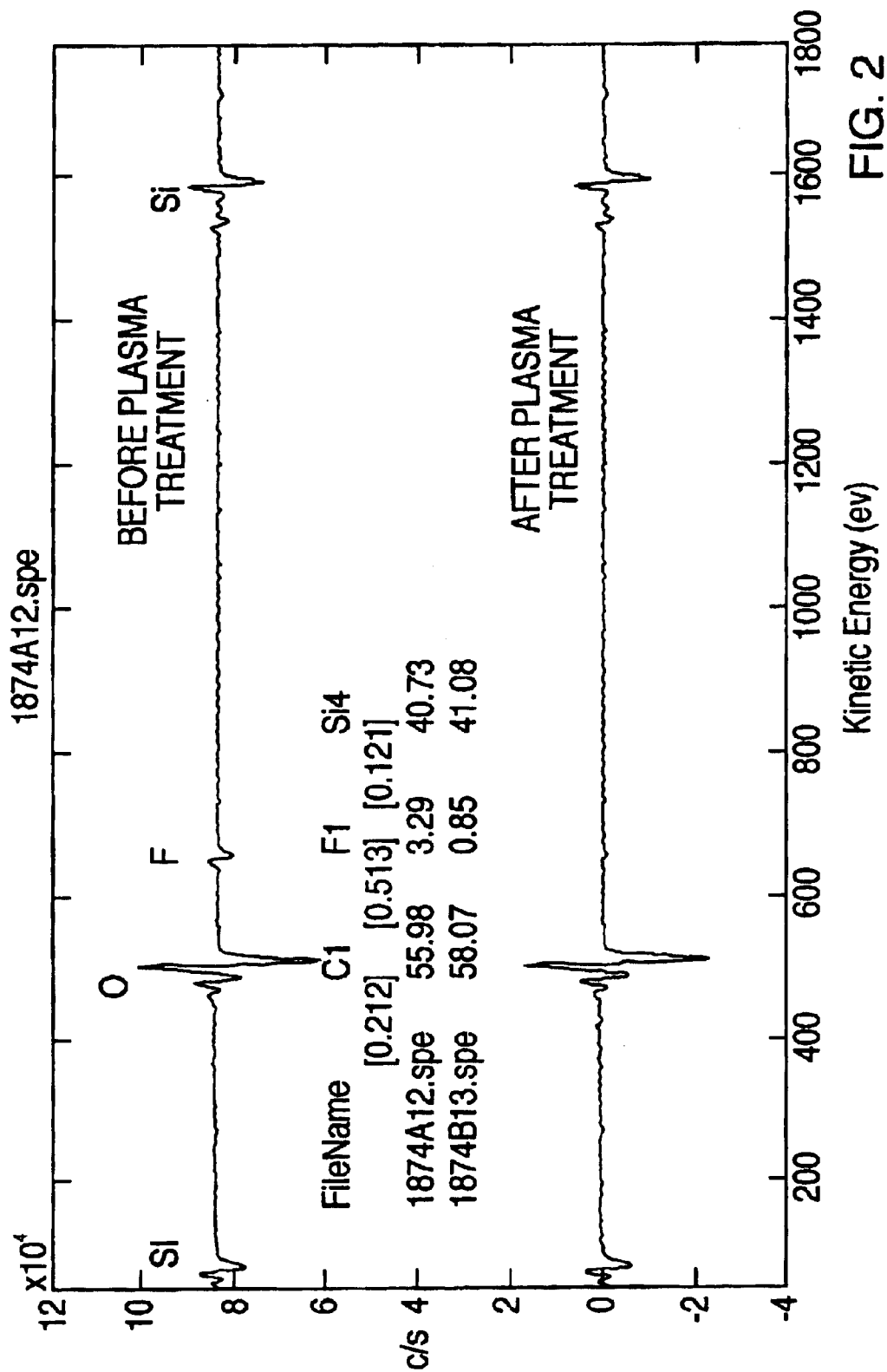
FIG. 2 graphically illustrates Auger Electron Spectroscopy results for a copper/fluorinated TEOS wiring structure before and after treatment with atomic hydrogen species.

FIG. 2 graphically illustrates the copper/FTEOS wiring structure after metal fill and planarization, i.e., before any sputtering. Here, the atomic ratio of fluorine before and after hydrogen plasma treatment is observed to be at least as high as about 4 to 1. Higher ratios are believed to be present, however, electron beam affects during Auger measurement of fluorine content impacts the sensitivity.

While the disclosure has been described with reference to an exemplary embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A process for lowering fluorine content after metal fill and planarization of a metal conductor and a fluorine-containing dielectric wire structure, consisting essentially of:
   generating a plasma containing atomic hydrogen species; and
   exposing the fluorine-containing dielectric to the atomic hydrogen species in an amount effective to lower the fluorine content in the fluorine-containing dielectric.

2. The process of claim 1, wherein lowering the fluorine content comprises removing fluorine from a surface of the fluorine-containing dielectric to a depth less than or equal to about 10 percent of a thickness of the fluorine-containing dielectric.

3. The process of claim 1, wherein lowering the fluorine content comprises removing fluorine from a surface of the fluorine-containing dielectric to a depth loss than or equal to about 5 percent of a thickness of the fluorine-containing dielectric.

4. The process of claim 1, wherein lowering the fluorine content comprises removing fluorine from at least about 200 angstroms from a surface of the fluorine-containing dielectric.

5. The process of claim 1, wherein lowering the fluorine content comprises removing fluorine from at least about 500 angstroms from a surface of the fluorine-containing dielectric.

6. The process of claim 1, wherein lowering the fluorine content comprises removing fluorine from at least about 700 angstroms from a surface of the fluorine-containing dielectric.

7. The process of claim 1, wherein generating atomic hydrogen species comprises energizing a hydrogen bearing gas to form plasma containing the atomic hydrogen species or heating the hydrogen bearing gas in a furnace to generate the atomic hydrogen species.

8. The process of claim 1, wherein the metal conductor comprises a copper metal.

9. The process of claim 1, wherein the fluorine content at about a surface of the fluorine-containing dielectric is less than about 2 percent after exposing the fluorine-containing dielectric to the atomic hydrogen species.

10. The polish process of claim 1, wherein the fluorine-containing dielectric comprises a fluorinated diamond like carbon dielectric, a fluorinated diamond like carbon dielectric with additives selected from the group consisting of hydrogen, silicon germanium, nitrogen and oxygen, fluorinated silicon oxide, fluorinated silicon glass, organo-inorganic dielectrics containing fluorine, or organic dielectrics containing fluorine.

11. The process of claim 10, wherein the plasma is formed from a gas mixture comprising a hydrogen-bearing compound.

12. The process of claim 10, wherein the hydrogen bearing compound comprises a hydrocarbon, a hydrofluorocarbon, a hydrogen gas, a water vapor, ammonia, or mixtures comprising at least one of the foregoing hydrogen bearing compounds.

13. The process of claim 12, wherein hydrogen gas comprises a mixture of the hydrogen gas with an inert gas.

14. A process for forming a wiring structure including a copper metal conductor end a fluorine-containing dielectric, consisting essentially of:
   forming a gap in a layer of the fluorine-containing dielectric;
   overfilling the gap with the copper metal conductor;
   planarizing and removing the copper metal conductor above the fluorine-containing dielectric to expose a surface of the fluorine-containing dielectric;
   forming a plasma from a hydrogen bearing gas to generate atomic hydrogen species, wherein the hydrogen bearing gas comprises a hydrocarbon, a hydrofluorocarbon, a hydrogen gas, a water vapor, or mixtures comprising at least one of the foregoing hydrogen bearing compounds;
   exposing the surface of the fluorine-containing dielectric to the atomic hydrogen species; and
   removing fluorine from and about the surface of the fluorine-containing dielectric.

15. The process according to claim 14, wherein exposing the surface of the fluorine-containing dielectric lowers the fluorine in at least about 200 angstroms from the surface of the fluorine-containing dielectric.

16. The process according to claim 14, wherein exposing the surface of the fluorine-containing dielectric lowers the fluorine in at least about 500 angstroms from the surface of the fluorine-containing dielectric.

17. The process according to claim 14, wherein exposing the surface of the fluorine-containing dielectric lowers the fluorine in at least about 700 angstroms from the surface of the fluorine-containing dielectric.

18. The process according to claim 14, wherein exposing the surface of the fluorine-containing dielectric lowers an amount of the fluorine from the surface to a depth less than or equal to about 20 percent of a thickness of the fluorine-containing dielectric.

19. The process according to claim 14, wherein the fluorine-containing dielectric comprises a fluorinated diamond like carbon dielectric, a fluorinated diamond like carbon dielectric with additives selected from the group consisting of hydrogen, silicon germanium, nitrogen and oxygen, fluorinated silicon oxide, fluorinated silicon glass, organo-inorganic dielectrics containing fluorine, or organic dielectrics containing fluorine.

20. The process according to claim 14, wherein exposing the surface of the fluorine-containing dielectric lowers an amount of the fluorine from and about the surface to less than about 2 percent.

21. A process for lowering fluorine content after metal fill and planarization of a metal conductor and a fluorine-containing dielectric wire structure, consisting essentially of:

generating atomic nitrogen species from nitrogen gas ($N_2$) or a mixture containing the nitrogen gas ($N_2$); and exposing the fluorine-containing dielectric to the atomic nitrogen species in an amount effective to lower the fluorine content in the fluorine-containing dielectric.

* * * * *